(12) United States Patent
Tung

(10) Patent No.: US 11,785,751 B2
(45) Date of Patent: Oct. 10, 2023

(54) ADAPTER WITH HEAT DISSIPATION LAYER

(71) Applicant: Steven Po-Cheng Tung, San Jose, CA (US)

(72) Inventor: Steven Po-Cheng Tung, San Jose, CA (US)

( * ) Notice: Subject to any disclaimer, the term of this patent is extended or adjusted under 35 U.S.C. 154(b) by 185 days.

(21) Appl. No.: 17/347,605

(22) Filed: Jun. 15, 2021

(65) Prior Publication Data
US 2022/0400587 A1  Dec. 15, 2022

(51) Int. Cl.
*H05K 7/20* (2006.01)

(52) U.S. Cl.
CPC ......... *H05K 7/20909* (2013.01); *H05K 7/209* (2013.01)

(58) Field of Classification Search
CPC .. H05K 7/20909; H05K 7/209; H01R 13/533; H01R 31/065
See application file for complete search history.

(56) References Cited

U.S. PATENT DOCUMENTS

| | | | |
|---|---|---|---|
| 7,443,673 B2 | 10/2008 | Tung | |
| 7,901,247 B2 * | 3/2011 | Ring | H01R 13/533 439/606 |
| 9,825,445 B2 * | 11/2017 | Metzler | H01R 13/506 |
| 2002/0154528 A1 * | 10/2002 | Ravid | H01R 31/065 363/146 |
| 2005/0202720 A1 * | 9/2005 | Burke | H01R 13/521 439/578 |
| 2008/0030950 A1 * | 2/2008 | Tung | H01R 33/94 361/695 |
| 2010/0122831 A1 * | 5/2010 | Watanabe | H01B 7/426 174/107 |
| 2018/0019544 A1 * | 1/2018 | Ishibashi | H02K 11/30 |
| 2018/0233860 A1 * | 8/2018 | Lin | H01R 12/725 |
| 2022/0084808 A1 * | 3/2022 | Shan | F21V 29/70 |

FOREIGN PATENT DOCUMENTS

| | | | |
|---|---|---|---|
| CN | 209744076 U | * | 12/2019 |
| JP | 3133336 | | 6/2007 |
| TW | M302239 | | 12/2006 |

* cited by examiner

*Primary Examiner* — Mandeep S Buttar
(74) *Attorney, Agent, or Firm* — Chun-Ming Shih; HDLS IPR SERVICES

(57) ABSTRACT

An adapter with a heat dissipation layer applied in locations of high electric current and provided for using in high-current electrical appliances, the adapter is provided with a heat dissipation fan on one side or on two sides at the same time, the heat dissipation fan is activated by a small amount of electric power from the adapter, so that the heat dissipation fan is capable of performing heat dissipation function for the adapter, and a guide rod in the adapter is sleeved with an embossed heat dissipation layer, which makes the adapter's heat dissipation effect better, thereby preventing the adapter from deteriorating due to high heat, maintaining product stability, prolonging service life, and reducing work accidents.

8 Claims, 12 Drawing Sheets

ADAPTER WITH HEAT DISSIPATION LAYER

BACKGROUND OF THE INVENTION

Field of Invention

The invention relates to an adapter structure with a heat dissipation layer, and more particularly to an adapter with an internal guide rod sleeved with an embossed heat dissipation layer.

Related Art

For some work locations that use high electric current, the adapter usually uses electricity continuously, which not only consumes a lot of electric power, but also has less rest time. Therefore, the adapter will inevitably be affected by high heat in such a working environment to cause safety concerns. Since the adapter must continue to provide high electric current, the material used is a heat-resistant and high-priced material to improve the safety and service life of the product. However, although the aforementioned continuous high temperature effect does not cause damage to the material of the general high-current adapter immediately, it is expected to be carbonized, discolored or deteriorated by heat after long time usage. During the long terms of usage, it will still cause damage to the adapter. Damage to the adapter itself may not be a big deal, but the resulting loss due to lag of work progress, or even loss caused by fire accidents, are difficult to estimate.

In view of the aforementioned drawbacks, the inventor of the invention has adopted an adapter with a heat dissipation fan, such as Taiwan Patent No. M302239, Japan Utility Model No. 3133336, and U.S. Pat. No. 744,673B2. Repeated experiments in multiple modes can achieve a more balanced design in form and performance, and can provide a better choice for users of high-current adapter.

However, if the high-current adapter is used for a long time, the guide rod in the adapter will still be in quite high temperature, which seems to be a small problem in what is otherwise perfect, so the invention encloses the guide rod in the adapter with an embossed heat dissipation layer, with expectation that the heat dissipation effect of the adapter will be better.

SUMMARY OF THE INVENTION

A main object of the invention is to provide an adapter with a heat dissipation fan and a guide rod sleeved with an embossed heat dissipation layer capable of being used continuously in a high-current working environment, and ensuring that the adapter maintains normal operation in order to maintain smooth work progress and safety in work locations.

Another object of the invention is to provide an adapter capable of operating for long period of time without deterioration or discoloration in order to maintain product stability and prolong a service life.

The adapter with the heat dissipation fan and the guide rod sleeved with the embossed heat dissipation layer capable of achieving the above objects is used in locations of high electric current, such as large factories, due to large amount of electric current being used, high heat is prone to occur at the adapter end, less serious consequences are carbonization, discoloration or deterioration of the adapter, more serious consequences are burnout and affecting work, and even accidents such as electric leakage or fire. Therefore, the adapter of the invention is provided with the heat dissipation fan on one side or on two sides at the same time, the heat dissipation fan is activated by a small amount of electric power from the adapter, so that the heat dissipation fan is capable of performing heat dissipation function for the adapter, and the guide rod in the adapter is sleeved with the embossed heat dissipation layer, which makes the adapter's heat dissipation effect better, thereby avoiding the problems of the adapter due to high heat in order to maintain work stability and ensure work safety.

BRIEF DESCRIPTION OF THE DRAWINGS

The techniques of the invention would be more understandable from the detailed description given herein below and the accompanying figures are provided for better illustration, and thus the description and figures are not limitative for the invention, and wherein.

DETAILED DESCRIPTION OF THE INVENTION

Figure 1:
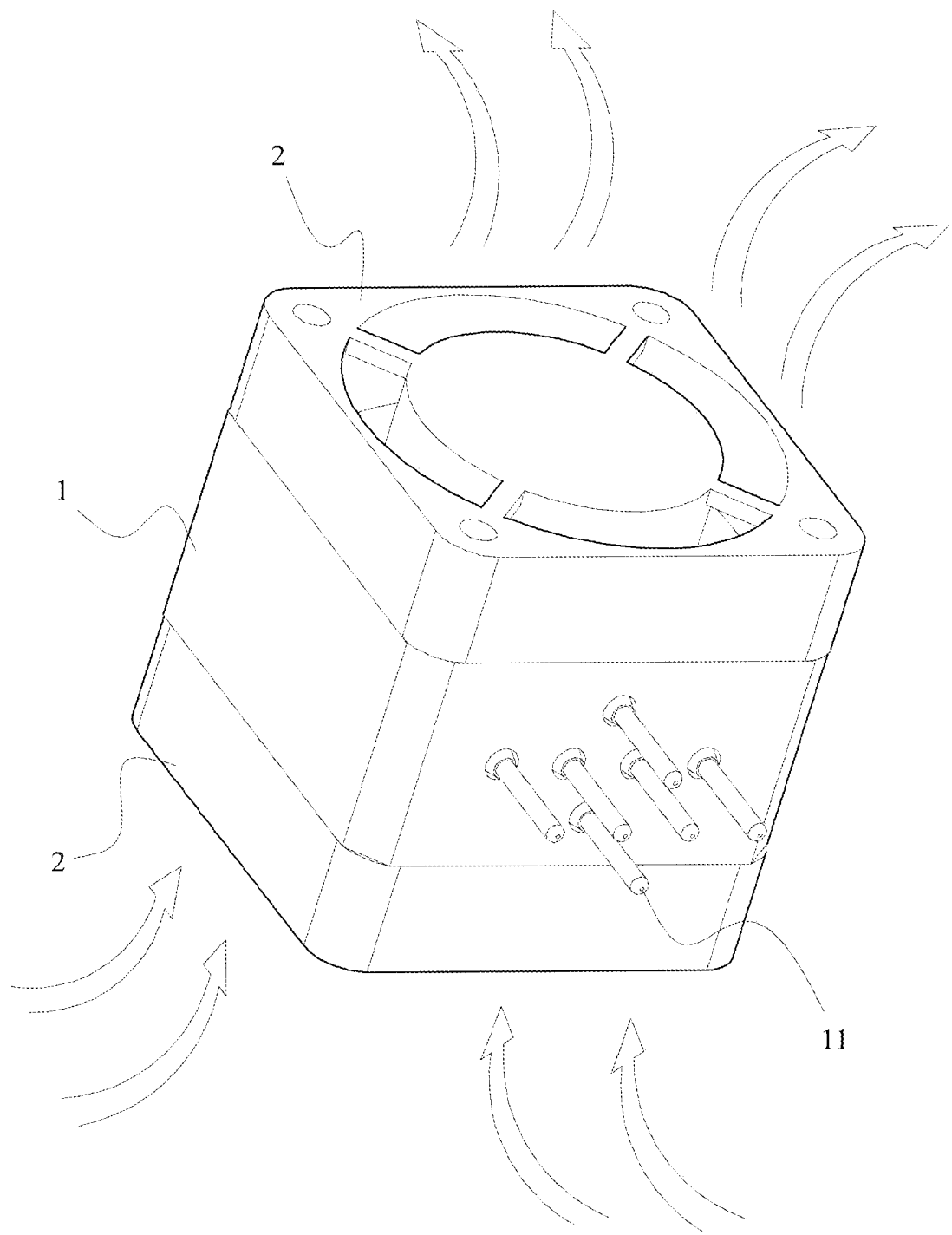
FIG. 1 is a perspective view of an adapter of the invention.
Figure 2:
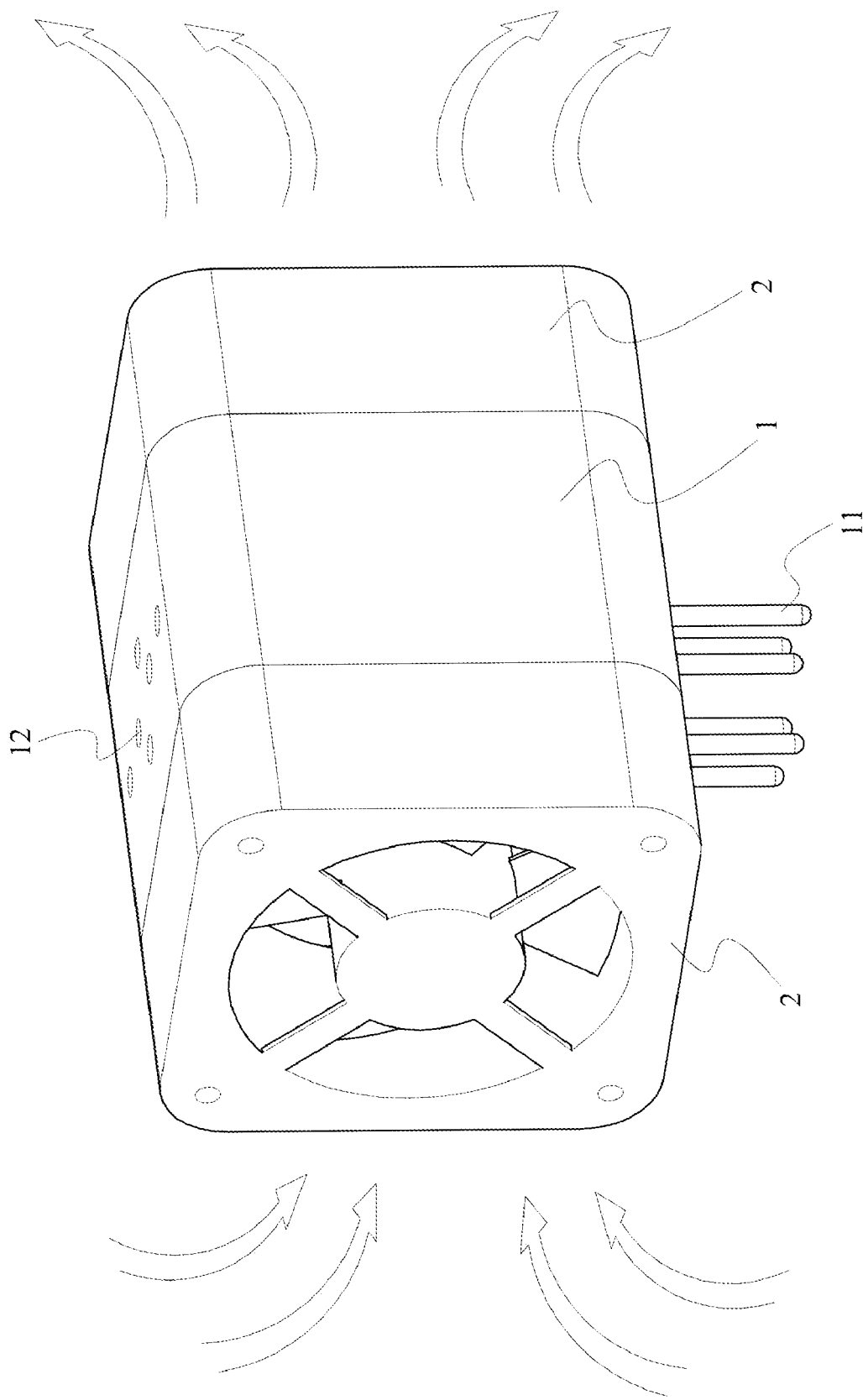
FIG. 2 is a perspective view of the adapter of the invention viewed from another direction.

Firstly, please refer to FIGS. 1 to 2. The invention is based on an adapter 1 with a heat dissipation fan 2, the adapter 1 is applied in high-current workplaces. One end of the adapter 1 is provided with a plug 11, and another end of the adapter 1 is provided with a socket 12, the plug 11 and the socket 12 are electrically connected, for example, a material with good conductivity is used for connection. A main structure on which the invention is based is that the heat dissipation fan 2 is disposed on one side or two sides of the adapter 1 at the same time. The heat dissipation fan 2 is activated by a small amount of electric power from the adapter 1. When the adapter 1 is connected to electric power, the heat dissipation fan 2 is capable of drawing/sending air from or to the adapter 1 internally so as to reduce heat inside the adapter 1 and achieve a function of heat dissipation.

Therefore, the adaptor 1 is capable of reducing heat generation and prolonging service life, suitable for using in work locations where high electric current is adopted, and capable of maintaining stability and safety in work. In addition, the adapter 1 can be used in series connection, that is, for ordinary plugs and sockets that would otherwise generate high heat, a structure of the adapter 1 can be connected in series between a plug and a socket to be capable of discharging heat by the heat dissipation fan 2 to achieve efficient heat dissipation.

The heat dissipation fan 2 can be a DC electric fan or an AC electric fan. For the heat dissipation fan 2 using DC power, a conventional rectifier can be disposed between the adapter 1 and the heat dissipation fan 2, so that an AC power supply connected to the adapter 1 after being rectified can be used by the heat dissipation fan 2. In addition, to match and cooperate with the structure of the adapter 1, one end of the adapter 1 can be directly provided with a power input line, and another end of the adapter 1 is provided with the socket 12, the input line is used to import electric power and the socket 12 is used to output electric power. In this way, the adapter 1 forms a power socket design, which can be used for plugging in other electrical appliances. By the same token, one end of the adaptor 1 can also be provided with the plug 11, and the other end of the adapter 1 is provided with an output line. The output line is used to output electric current to other electrical appliances. Thereby, the adaptor 1 can directly become a power plug for an electrical appliance. If a number of pins of the plug 11 of the adapter 1 is two, it will be the same as two pins of a general plug, and if a number of jacks of the socket 12 is two, it will be the same as two holes of a general socket.

In addition, the invention does not limit number and size of the pins of the plug 11 or the socket 12, for example, as shown in FIGS. 1 and 2, numbers of pins of the plug 11 and the socket 12 are six respectively. Of course, other changes in quantity or size are also included in the invention.

Figure 3:
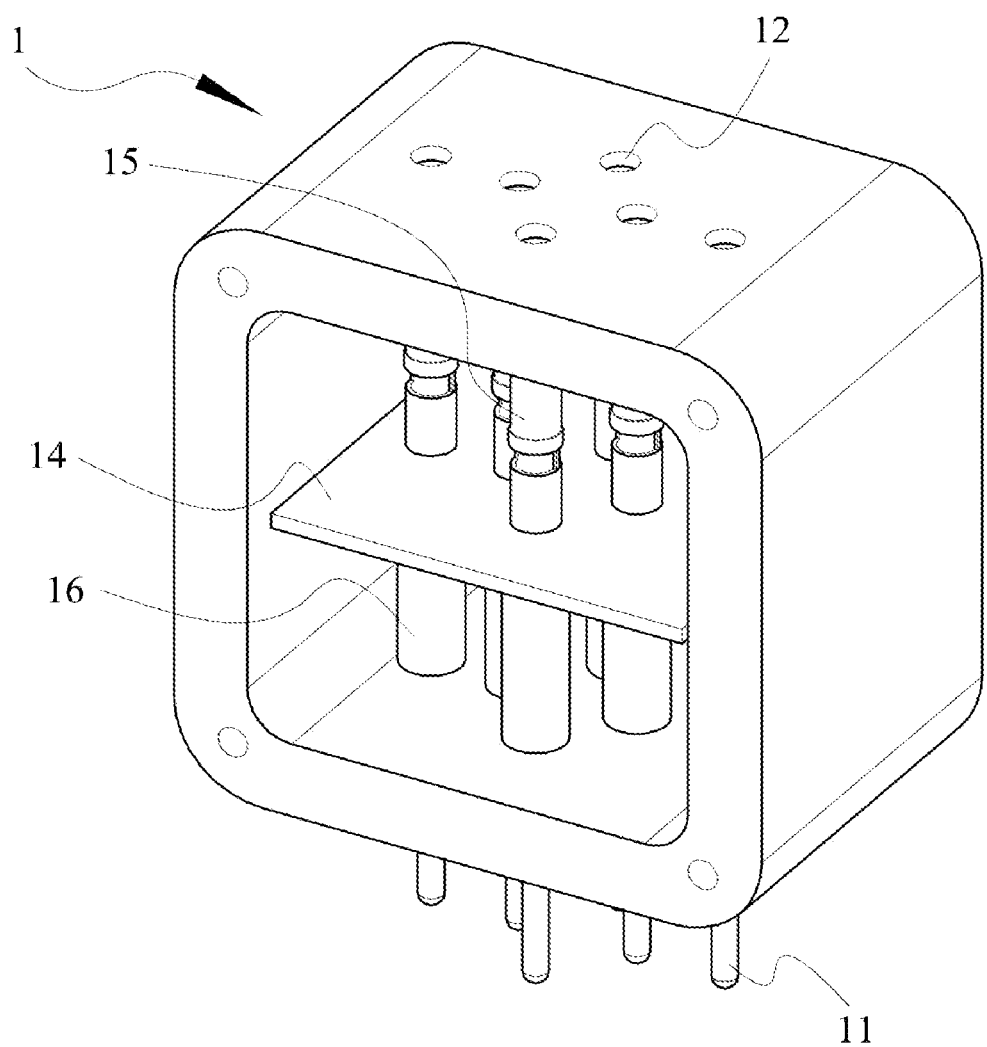
FIG. 3 is a perspective view of an internal structure of the adapter of the invention.
Figure 4:
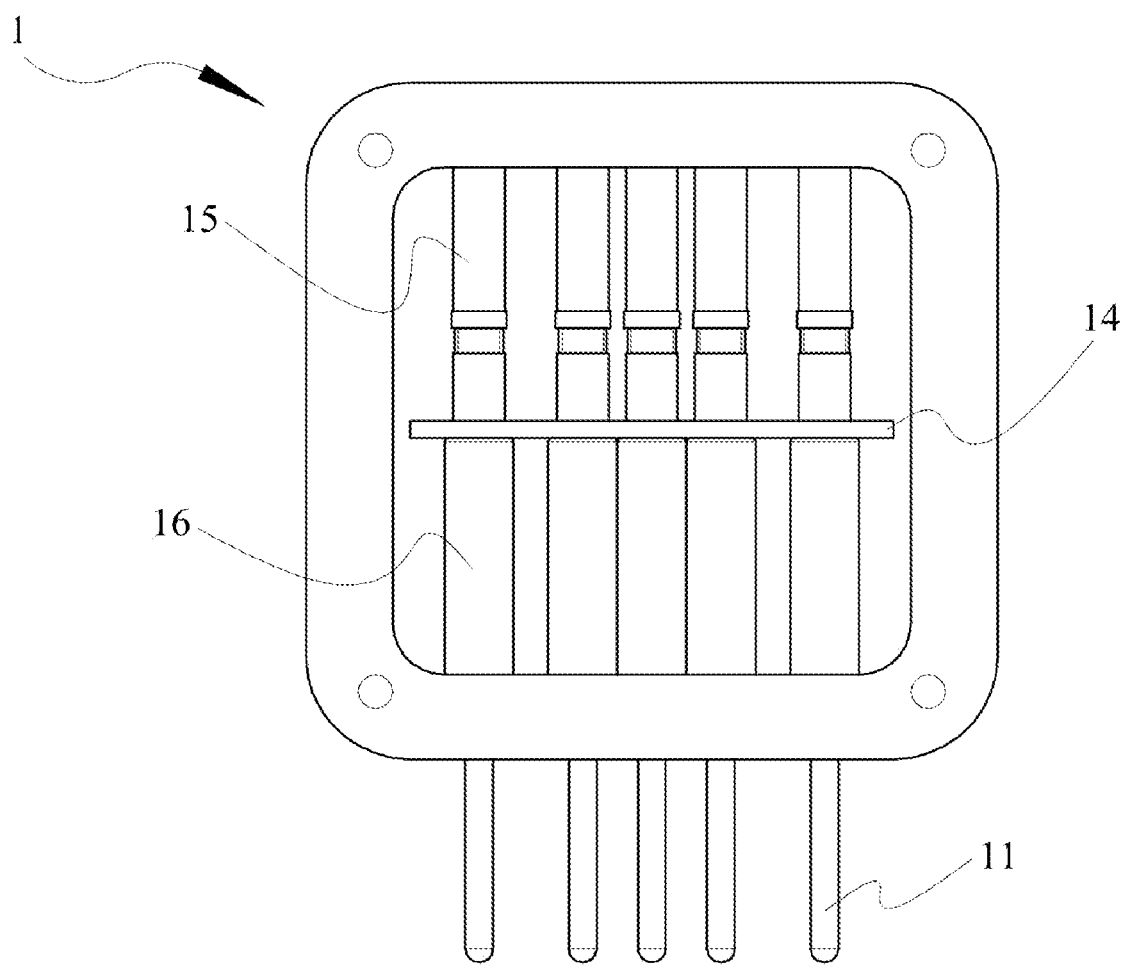
FIG. 4 is a plan view of an internal structure of the adapter of the invention.
Figure 5A:
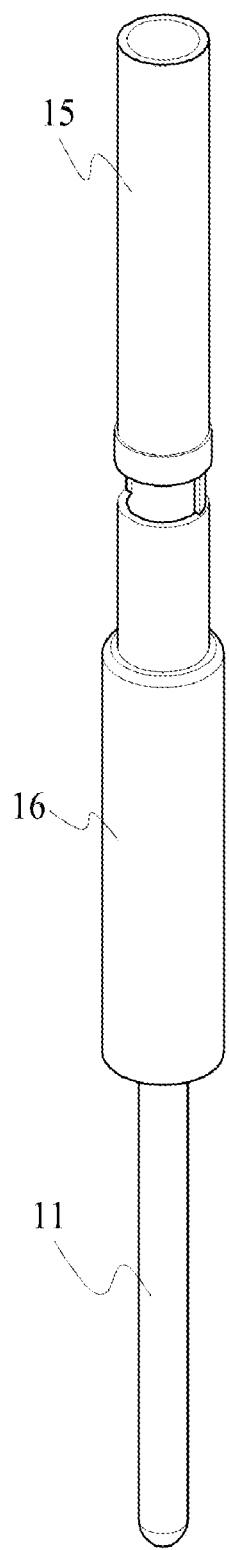
FIG. 5A is a structural perspective view of a guide rod of the invention.

Furthermore, FIGS. 3 and 4 show an internal structure of the adapter 1 of the invention. The adapter 1 comprises a circuit board 14 in a middle internally (circuit in the circuit board 14 is omitted here), the circuit board 14 comprises an upper guide rod 15 disposing in a direction facing toward a power output end, and the circuit board 14 also comprises a lower guide rod 16 disposing in a direction facing toward a power input end; as shown in FIG. 5A, inside an inner edge of the upper guide rod 15 is a jack for inserting a pin of other electronic products, and the lower guide rod 16 is a pin of the adapter 1, which can be inserted into a jack of other electronic products.

Figure 5B:
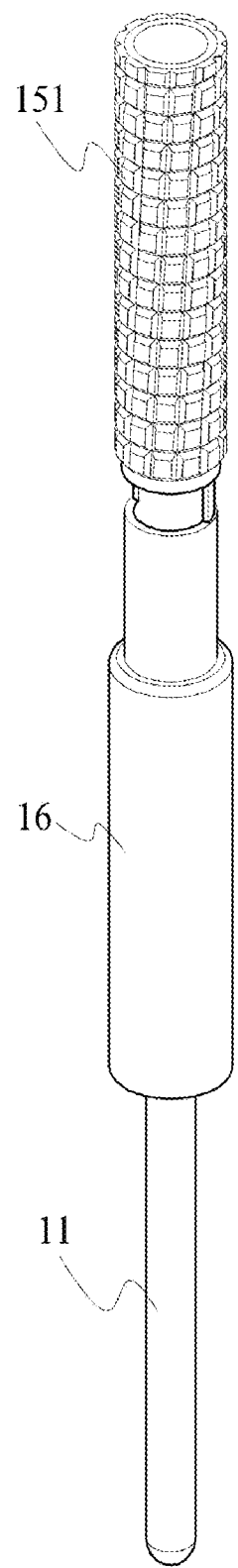
FIG. 5B is a perspective view of an upper guide rod sleeved with an embossed heat dissipation layer of the invention.
Figure 6:
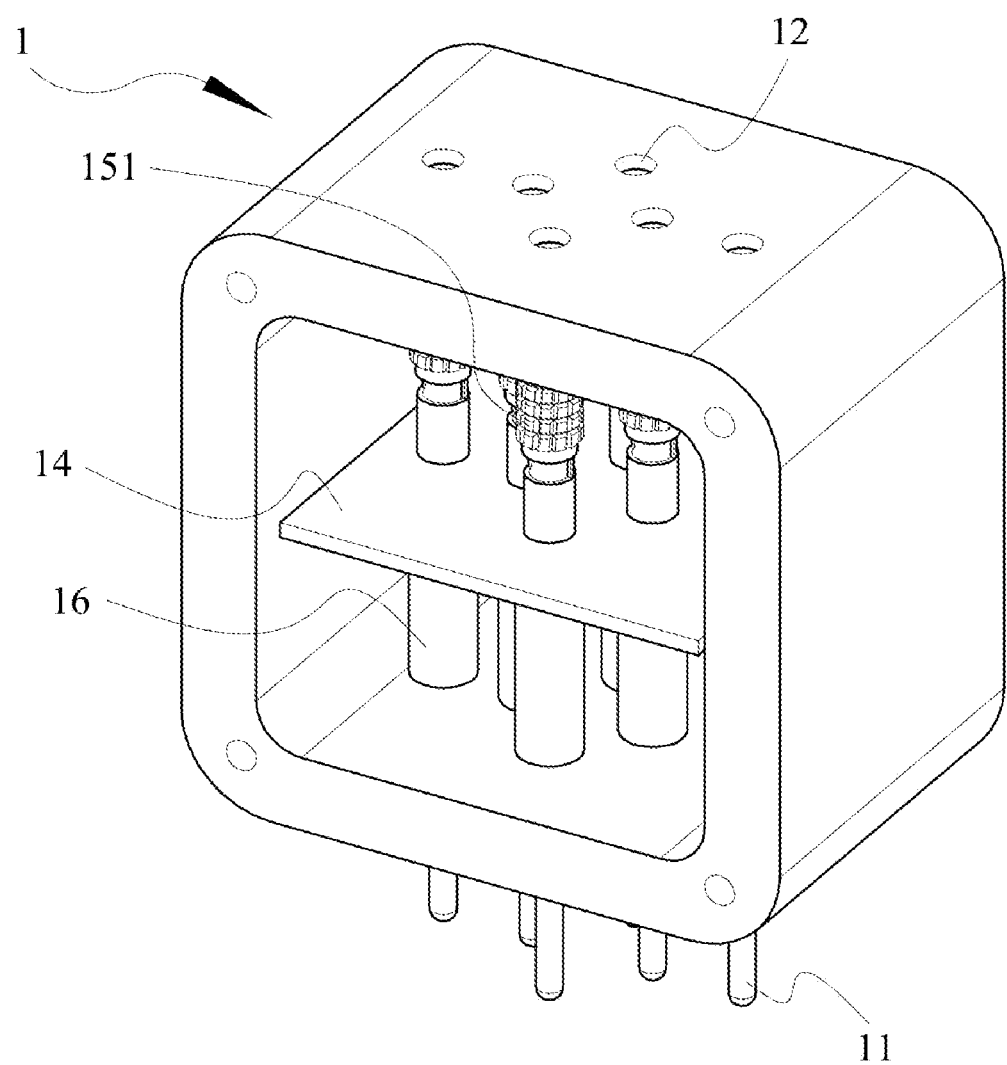
FIG. 6 is a perspective view of the upper guide rod sleeved with the embossed heat dissipation layer inside the adapter of the invention.
Figure 7:
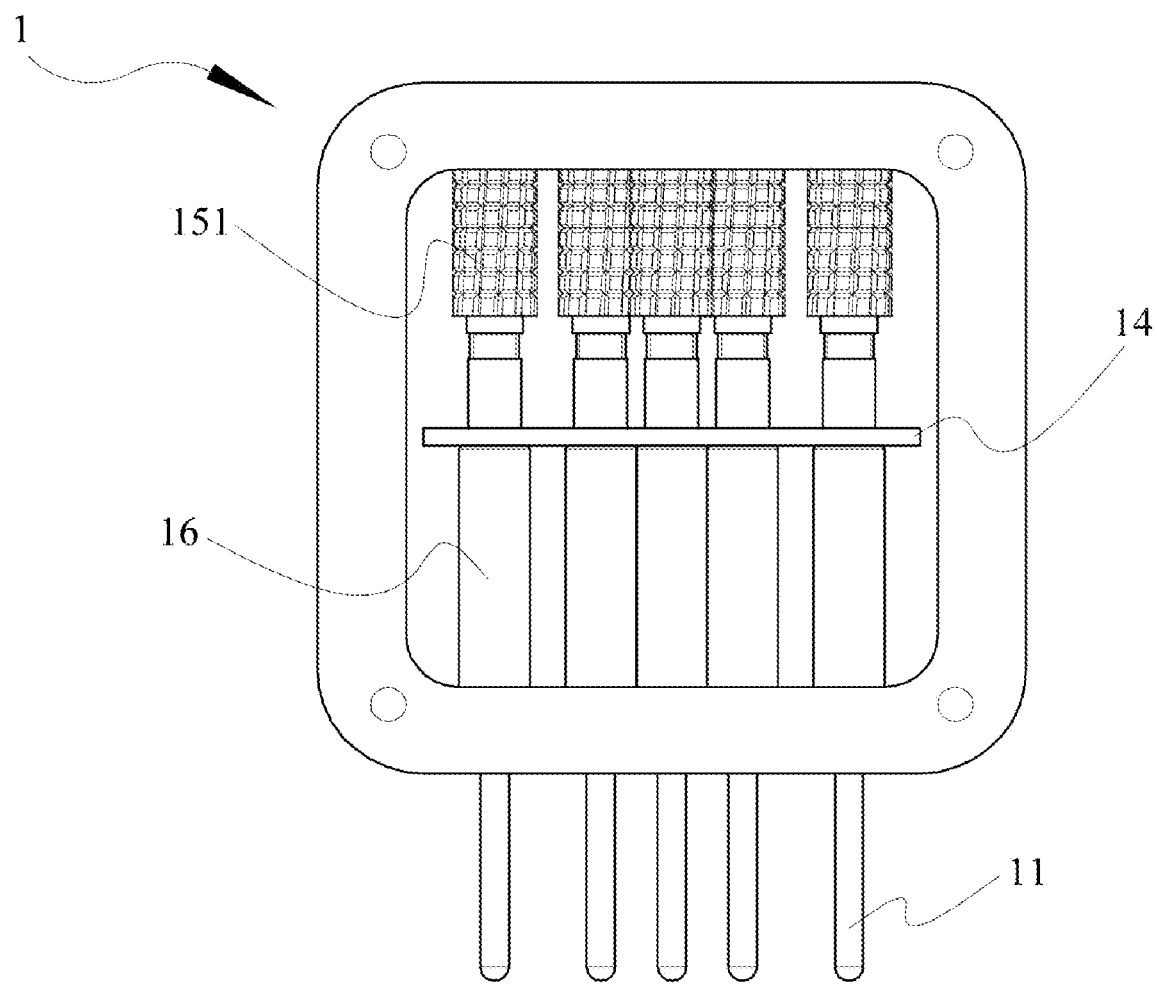
FIG. 7 is a plan view of the upper guide rod sleeved with the embossed heat dissipation layer inside the adapter of the invention.

FIGS. 6 and 7 are respectively perspective view and plan view of the upper guide rod 15 sleeved with an embossed heat dissipation layer inside the adapter 1 of the invention. Because the upper guide rod 15 facing toward a direction of the power output end often has a temperature higher than the lower guide rod 16 facing toward a direction of the power input end (due to large electric current), the upper guide rod 15 facing toward a direction of the power output end is sleeved with an embossed heat dissipation layer 151 as shown in FIG. 5B, the embossed heat dissipation layer 151 has a rough surface with creases to increase an air contact surface, with this principle the upper guide rod 15 enclosed therein is capable of effectively diffusing heat, providing excellent heat dissipation effect in an electrical connection environment of high voltage, high temperature and high electric current.

Figure 5C:
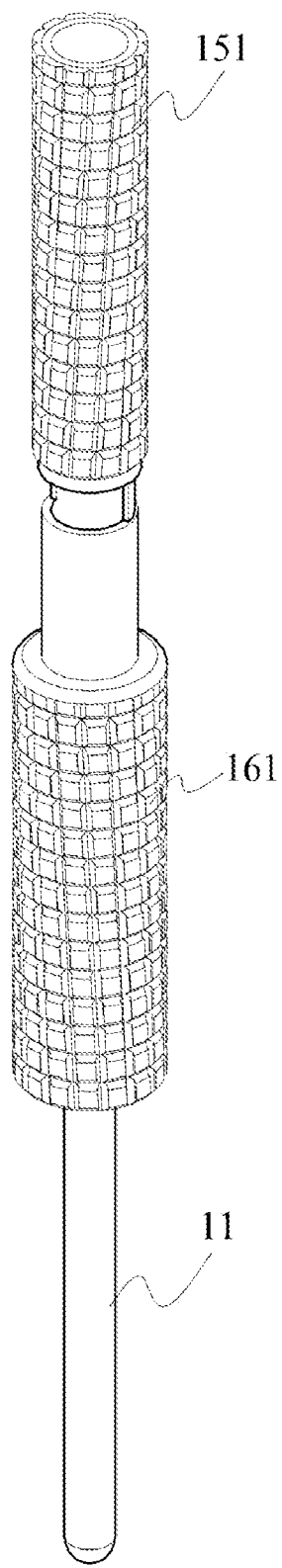
FIG. 5C is a perspective view of the upper guide rod and a lower guide rod respectively sleeved with the embossed heat dissipation layer of the invention.
Figure 8:
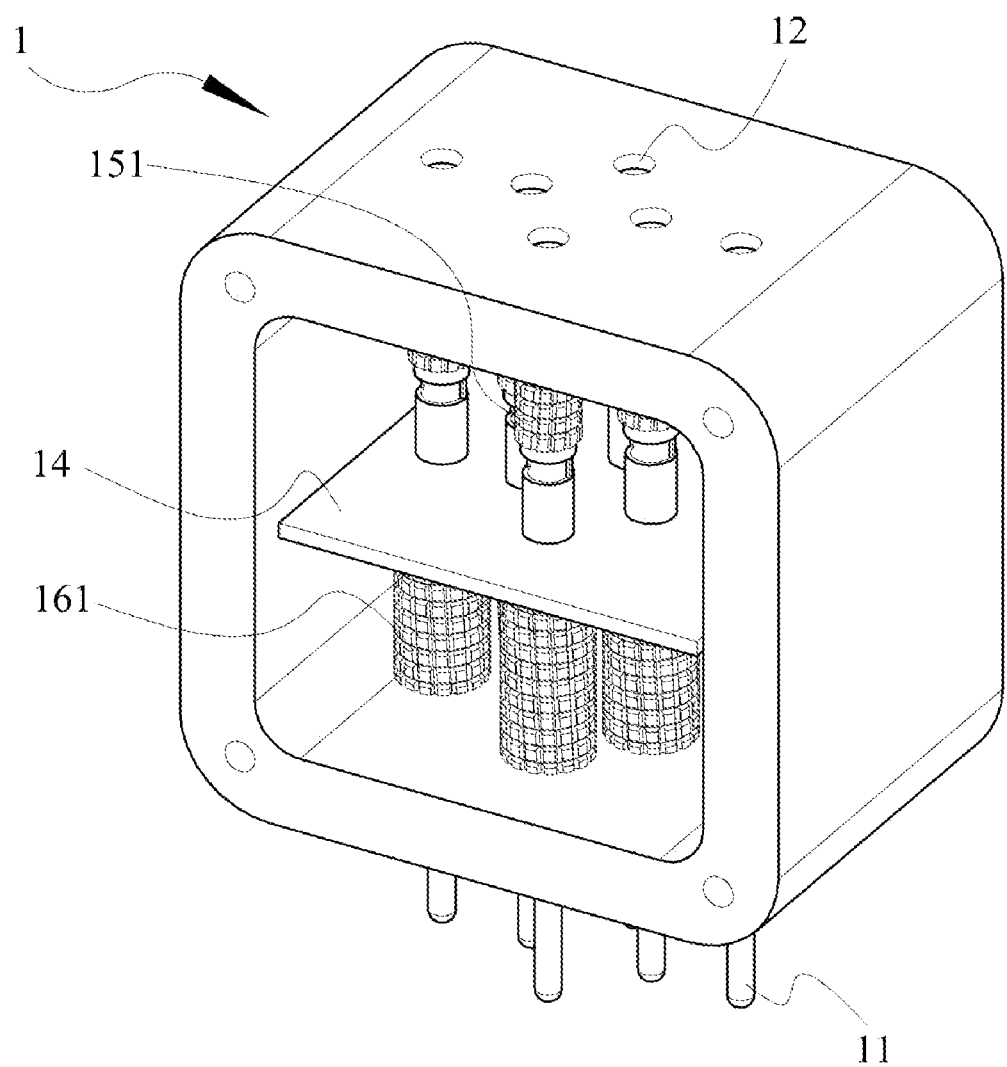
FIG. 8 is a perspective view of the upper guide rod and the lower guide rod respectively sleeved with the embossed heat dissipation layer inside the adapter of the invention.
Figure 9:
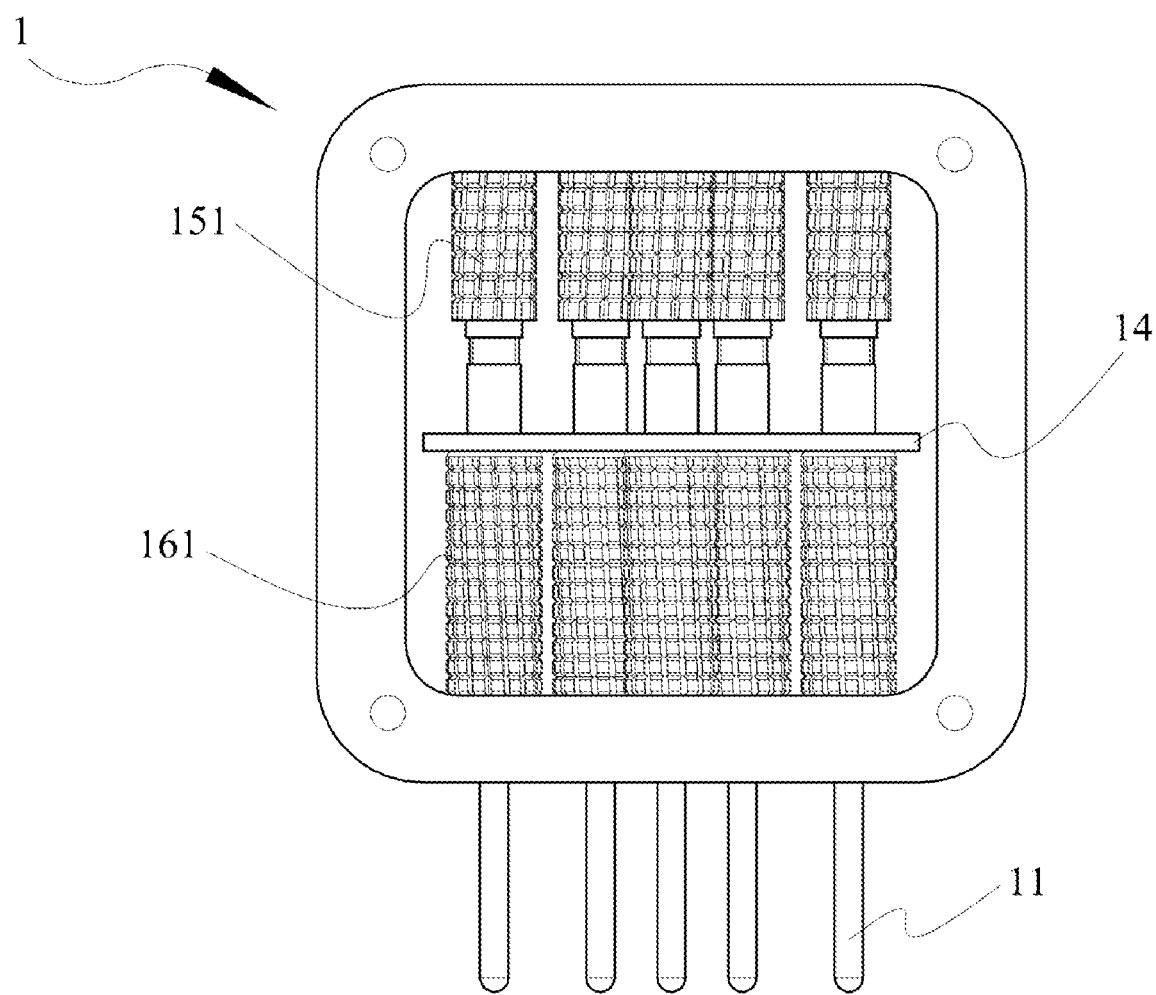
FIG. 9 is a plan view of the upper guide rod and the lower guide rod respectively sleeved with the embossed heat dissipation layer inside the adapter of the invention.

FIGS. 8 and 9 are respectively perspective view and plan view of the upper guide rod 15 and the lower guide rod 16 respectively sleeved with the embossed heat dissipation layer inside the adapter 1 of the invention. The lower guide rod 16 facing toward a direction of the power input end is also sleeved with an embossed heat dissipation layer 161, as shown in FIG. 5C, the embossed heat dissipation layers 151, 161 are capable of achieving better heat dissipation effect.

Figure 10:
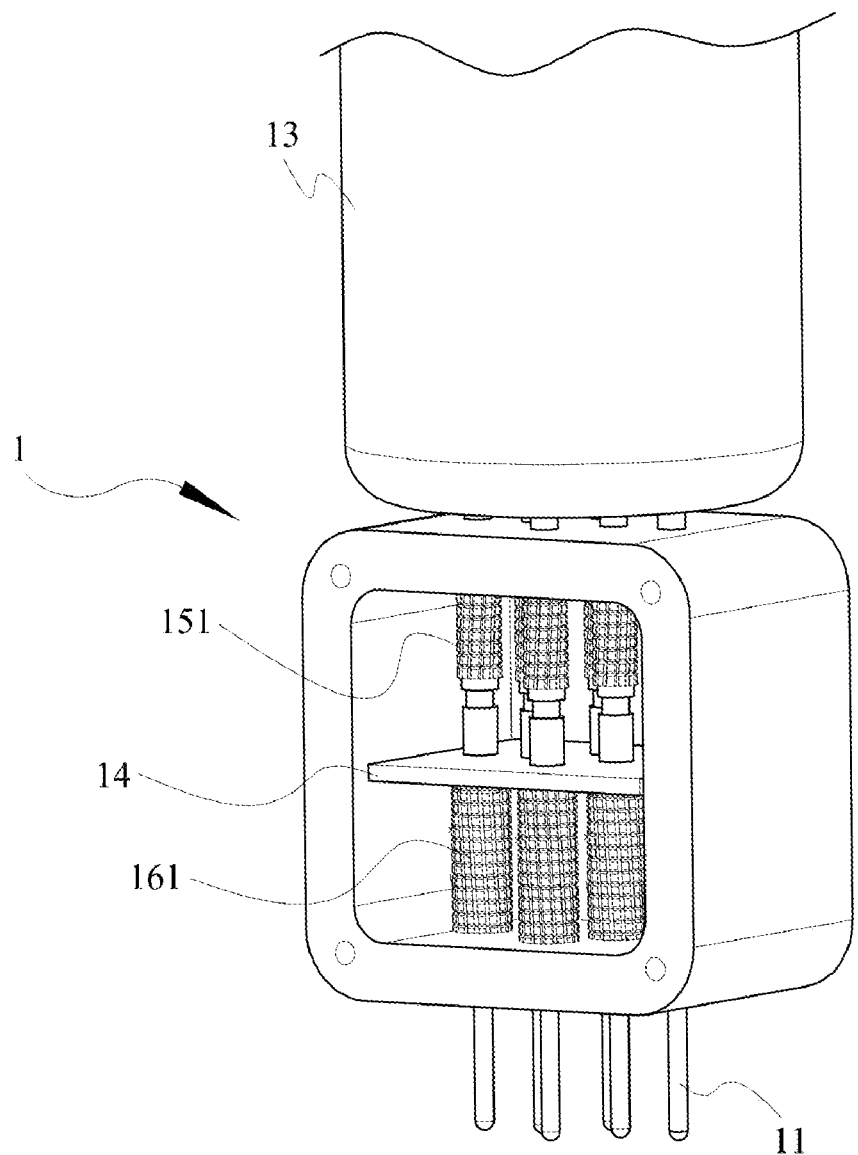
FIG. 10 is a perspective view of the adapter of the invention connected to a load.

Particularly, when the adapter 1 of the invention is used on a load device that generates heat, the load device is capable of transferring heat outwardly from inside of the device through pins of the device to the adapter 1. The embossed heat dissipation layers 151, 161 inside the adapter 1 are capable of achieving excellent heat dissipation effect. FIG. 10 is a perspective view to exemplify the adapter 1 being connected to a load 13 that generates heat.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An adapter with a heat dissipation layer used in locations of high electric current comprising:
   an adapter
   a heat dissipation fan;
   a circuit board; wherein the adapter is provided with the heat dissipation fan on one side or on two sides at the same time, the heat dissipation fan is activated by a small amount of electric power from the adapter, so that the heat dissipation fan is capable of performing heat dissipation for the adapter; the adapter comprises the circuit board in a middle internally, the circuit board comprises an upper guide rod disposed in a direction facing toward a power output end, and the circuit board comprises a lower guide rod disposed in a direction facing toward a power input end;
   a first embossed heat dissipation layer sleeved on the upper guide rod facing toward a direction of the power output end, and the first embossed heat dissipation layer having a rough surface with creases; and
   a second embossed heat dissipation layer sleeved on the lower guide rod facing toward a direction of the power input end, and the second embossed heat dissipation layer having a rough surface with creases.

2. The adapter with the heat dissipation layer as claimed in claim 1, wherein the heat dissipation fan is an AC electric fan.

3. The adapter with the heat dissipation layer as claimed in claim 2, wherein one end of the adapter is provided with a plug, another end of the adapter is provided with a socket, and the plug and the socket are electrically connected to make the adapters capable of using in series connection.

4. The adapter with the heat dissipation layer as claimed in claim 2, wherein one end of the adapter is provided with a plug, another end of the adapter is provided with an output line, and the output line is used to output electric current for use in electrical appliances.

5. The adapter with the heat dissipation layer as claimed in claim 3, wherein one end of the adaptor is provided with an input line, another end of the adapter is provided with a socket, and the input line is used to import electric power to be output from the socket.

6. The adapter with the heat dissipation layer as claimed in claim 5, wherein a quantity of pins of the plug or the socket is two or more than two capable of conducting electric power.

7. The adapter with the heat dissipation layer as claimed in claim 6, wherein locations of high electric current refer to locations where a load end itself generates heat.

8. The adapter with the heat dissipation layer as claimed in claim 7, wherein the load end itself transfers heat outwardly from inside of the load end through pins of the load end to the adapter.

\* \* \* \* \*